United States Patent
Takada

(10) Patent No.: US 8,374,305 B2
(45) Date of Patent: Feb. 12, 2013

(54) CLOCK RECOVERY CIRCUIT AND DATA RECOVERY CIRCUIT

(75) Inventor: Shuichi Takada, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 498 days.

(21) Appl. No.: 12/717,449

(22) Filed: Mar. 4, 2010

(65) Prior Publication Data
US 2011/0064176 A1    Mar. 17, 2011

(30) Foreign Application Priority Data
Sep. 14, 2009   (JP) ................. 2009-212290

(51) Int. Cl.
  *H04L 7/00* (2006.01)
(52) U.S. Cl. ................................................. 375/355
(58) Field of Classification Search .......... 375/220, 375/224, 229, 316, 326, 327, 340, 344, 350, 375/354, 355, 371, 373, 375, 376; 327/141, 327/147, 157, 158, 161, 165, 241
See application file for complete search history.

(56) References Cited

U.S. PATENT DOCUMENTS

| | | | |
|---|---|---|---|
| 7,246,018 B1 | 7/2007 | Lo et al. | |
| 7,817,767 B2 * | 10/2010 | Tell et al. | 375/376 |
| 2004/0252804 A1 * | 12/2004 | Aoyama | 375/376 |
| 2005/0201500 A1 * | 9/2005 | Shizuki | 375/350 |
| 2006/0056564 A1 * | 3/2006 | Takeuchi | 375/376 |
| 2007/0047683 A1 * | 3/2007 | Okamura et al. | 375/355 |
| 2007/0146014 A1 * | 6/2007 | Cheung | 327/20 |

FOREIGN PATENT DOCUMENTS

JP    2007-060652    3/2007

OTHER PUBLICATIONS

Toifl, et al. A 0.94-ps-RMS-Jitter 0.016-mm2 2.5-GHz Multiphase Generator PLL with 360 Digitally Programmable Phase Shift for 10-Gb/s Serial Links, IEEE Journal of Solid-State-Circuits, vol. 40, No. 12, pp. 2700-2712, Dec. 2005.

* cited by examiner

*Primary Examiner* — David C. Payne
*Assistant Examiner* — Syed Haider
(74) *Attorney, Agent, or Firm* — Turocy & Watson, LLP

(57) ABSTRACT

A serial input signal is sampled in synchronization with a plurality of first clock signals to obtain a plurality of sampling data pieces. A phase comparison circuit outputs a serial phase information signal based on the sampling data pieces. A serial-parallel conversion circuit performs a serial-to-parallel conversion on the serial phase information signal in synchronization with a second clock signal having a lower frequency, to output a parallel phase information signal. A digital filtering circuit calculates phase deviation and phase advance-delay signals based on the parallel phase information signal in synchronization with the second clock signal. By these signals, a phase control amount processing circuit generates a phase control signal. The phase control signal is in synchronization with third clock signals having a higher frequency. A phase interpolation circuit adjusts the phases of the third clock signals based on the phase control signal to output the first clock signals.

14 Claims, 12 Drawing Sheets

| QUADRANT | IP | QP | I1 | I2 | I3 | I4 |
|---|---|---|---|---|---|---|
| 1 | 1 | 1 | I1 | I2 | 0 | 0 |
| 2 | 0 | 1 | 0 | I2 | I3 | 0 |
| 3 | 0 | 0 | 0 | 0 | I3 | I4 |
| 4 | 1 | 0 | I1 | 0 | 0 | I4 |

FIG. 12 and DATA RECOVERY CIRCUIT

CROSS REFERENCE TO RELATED APPLICATION

This application is based upon and claims the benefit of priority from the prior Japanese Patent Application No. 2009-212290, filed on Sep. 14, 2009, the entire contents of which are incorporated herein by reference.

FIELD OF THE INVENTION

The invention relates to a clock recovery circuit which recovers a clock signal from a received signal, and to a data recovery circuit which recovers a data signal by using a recovered clock signal.

DESCRIPTION OF THE BACKGROUND

In many gigahertz-class high-speed data transmissions, a transmitter converts parallel data into serial data and transmit the converted serial data to a receiver by a serial transmission. The receiver receives the transmitted serial data and converts it into parallel data.

In a usual receiver used in such high-speed serial data transmissions, serial data are sampled using a clock signal recovered from serial data. Further, data of the serial data are received and recovered in synchronization with a clock signal on the receiver side. A clock recovery circuit recovers a clock signal from a received serial data. A data recovery circuit recovers data of the received serial data using the recovered clock signal.

The clock recovery circuit needs to generate a stable synchronized clock signal by eliminating a jitter component included in the received data, to sample the serial data by using the recovered clock signal. Therefore, the clock recovery circuit is required to have a filter circuit for jitter elimination.

The filter circuit parallelizes information on a transition edge of the received serial data, and performs a digital filtering processing on the parallelized data. The digital filtering processing generates a stable synchronized clock signal not having jitter components in the range from a low frequency to a high frequency.

A signal used for a high-speed serial data transmission includes high-level EMI noise. Accordingly, a technique for reducing the EMI noise has been developed. In the technique, the transmitter side uses a spread spectrum clock (hereinafter referred to as a "SSC") for a serial-data generation clock.

In the SSC, the frequency of transmission data transmitted using a spread spectrum clock signal is obtained by frequency-modulating at a frequency of several kilohertz, for example, with respect to a clock of the receiver side, which ranges from several hundreds ppm to several thousands ppm. Therefore, the transmission data can be regarded data modulated at very high frequency. Accordingly, the clock recovery circuit requires a function of tracking jitter components modulated at high frequency.

Thus, the clock recovery circuit adopting the SSC technique needs to perform conflicting operations. One of the operations is elimination of the jitter components in the range from a low frequency to a high frequency. The other of the operations is tracking of a signal modulated at a high frequency.

Japanese Patent Application Publication No. 2007-60652 (hereinafter, referred to as "JP2007-60652") discloses a clock data recovery circuit adopting the SSC technique. In the clock data recovery (hereinafter, referred to as "CDR") circuit, a sampler samples serial data in response to a recovery clock signal, and generates a serial sampling pulse. A CDR loop converts the serial sampling pulse into parallel data. The CDR loop generates multiple relatively-slow phase signals by using the parallel data. Further, the CDR loop generates a relatively-fast phase control signal by using the multiple relatively-slow phase signals. In addition, a phase interpolator advances or delays the phase of a reference clock signal, which is provided from outside, in response to the phase control signal. As a result, a recovery clock signal is generated.

The CDR circuit can operate at a high speed with minor phase errors.

However, in the CDR circuit disclosed in the patent document, the phase control signal generated by the CDR loop operates at a frequency corresponding to only $1/2n$ of the frequency of the reference clock signal, where "n" is a positive integer. Even when four-phase clock signals having 90° phase differences are used, the phase control signal operates at a frequency corresponding to only $2/n$ of the frequency of the reference clock signal.

When a bit rate of high-speed serial data is 1 GHz and the high-speed serial data are converted into parallel data of 10 bits (n=10), for example, the CDR circuit operates only at a frequency of 50 MHz (200 MHz at most).

As a result, in the CDR circuit, the amount of adjustment, which can be performed at one time, increases. It causes increase in clock jitters, with increase of the transmission rate of high-speed serial data transmission, or with increase of the number of bits of serial/parallel conversion.

SUMMARY OF THE INVENTION

An aspect of the present invention provides a clock recovery circuit for recovering clock signal based on inputted serial signal, which includes a plurality of samplers configured to sample a serial input signal in synchronization with a plurality of first clock signals having different phases respectively and to output a plurality of sampling data pieces, a phase comparison circuit configured to output a serial phase information signal on the basis of the sampling data pieces, the serial phase information signal representing a phase relationship between a clock of the serial input signal and the different phases of the first clock signals, a serial-parallel conversion circuit configured to perform a serial-to-parallel conversion on the serial phase information signal in synchronization with a second clock signal having a frequency lower than that of the first clock signals, and to output a parallel phase information signal, a digital filtering circuit configured to calculate a phase deviation signal and a phase advance-delay signal on the basis of the parallel phase information signal, in synchronization with the second clock signal, a phase control amount processing circuit configured to generate a phase control signal on the basis of the phase deviation signal and the phase advance-delay signal and to output the phase control signal, the phase control signal being in synchronization with third clock signals having a frequency higher than that of the second clock signal, and a phase interpolation circuit configured to adjust the phases of the third clock signals on the basis of the phase control signal, and to output the first clock signals as recovery clock signals.

Another aspect of the present invention provides a data recovery circuit for recovering clock signal based on inputted serial signal and for recovering data of the inputted serial signal, which includes a plurality of samplers configured to sample a serial input signal in synchronization with a plurality of first clock signals having different phases respectively and to output a plurality of sampling data pieces, a phase comparison circuit configured to output a serial phase information signal on the basis of the sampling data pieces, the serial phase information signal representing a phase relationship between a clock of the serial input signal and the different phases of the first clock signals, a first serial-parallel conversion circuit configured to perform a serial-to-parallel conversion on the serial phase information signal in synchronization with a second clock signal having a frequency lower than that of the first clock signals, and to output a parallel phase information signal, a digital filtering circuit configured to calculate a phase deviation signal and a phase advance-delay signal on the basis of the parallel phase information signal, in synchronization with the second clock signal, a phase control amount processing circuit configured to generate a phase control signal on the basis of the phase deviation signal and the phase advance-delay signal and to output the phase control signal, the phase control signal being in synchronization with third clock signals having a frequency higher than that of the second clock signal, a phase interpolation circuit configured to adjust the phases of the third clock signals on the basis of the phase control signal, and to output the first clock signals as recovery clock signals, and a second serial-parallel circuit configured to perform a serial-to-parallel conversion on the sampled data pieces in synchronization with the first clock signals, and to output recovery data.

BRIEF DESCRIPTION OF THE DRAWINGS

FIG. 12 is a table showing an example of a phase control signal represented in thermometer code.

DETAILED DESCRIPTION OF THE EMBODIMENTS

Figure 1:
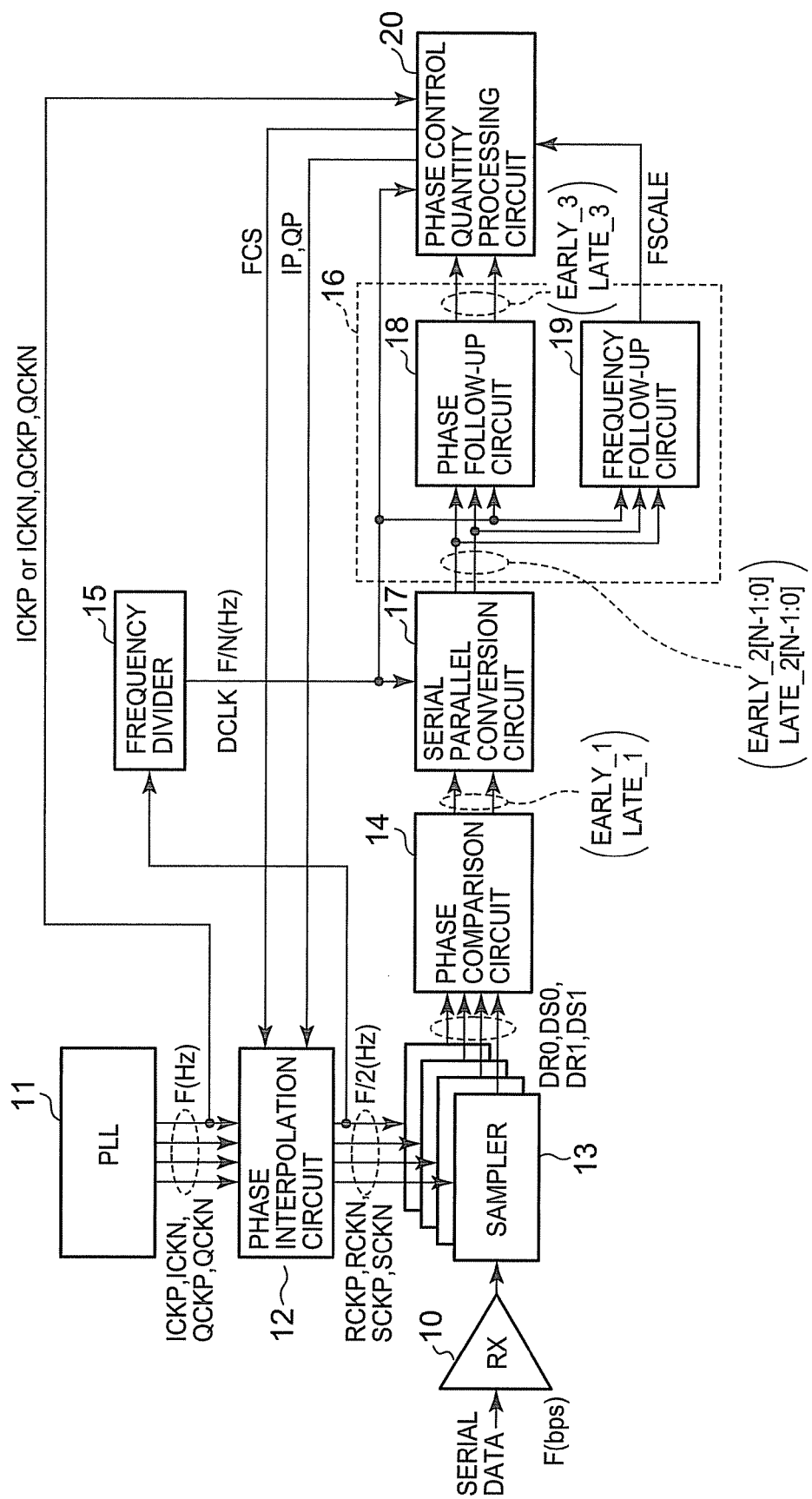
FIG. 1 is a block diagram showing a configuration of a clock recovery circuit according to an embodiment of the invention.

Hereinafter, a clock recovery circuit and a data recovery circuit, according to embodiments of the invention, will be described in detail with reference to the accompanying drawings. In the drawings, the same reference symbols designate the same or similar portions respectively.

FIG. 1 is a block diagram showing a configuration of the clock recovery circuit. The clock recovery circuit may be arranged in a receiver. As shown in FIG. 1, the clock recovery circuit is provided with a receiving circuit 10, a PLL (Phase-Locked Loop) circuit 11, a phase interpolation circuit 12, four samplers 13, a phase comparison circuit 14, a frequency divider circuit 15, a serial/parallel conversion circuit 17, a phase tracking circuit 18, a frequency tracking circuit 19, and a phase control amount processing circuit 20.

The phase tracking circuit 18 and the frequency tracking circuit 19 form a digital filtering circuit 16 which is shown by a dashed line in FIG. 1. The digital filtering circuit 16 operates with a relatively low-speed clock signal (DCLK) outputted from the frequency divider circuit 15.

The operation of the clock recovery circuit shown in FIG. 1 will be described. Serial data of F (bps) are inputted into the receiving circuit 10 of the clock recovery circuit. The serial data include a clock signal superimposed on data.

The PLL circuit 11 generates four-phase clock signals ICKP, ICKN, QCKP, QCKN of F (Hz), each of which is phase-shifted from a reference clock signal and each of which has a 90-degree phase difference between itself and the adjacent one of the signals. The PLL circuit 11 outputs the four-phase clock signals to the phase interpolation circuit 12. The phase interpolation circuit 12 adjusts or interpolates the phases of the four-phase clock signals inputted from the PLL circuit 11, based on a phase control signal FCS which is outputted from the phase control amount processing circuit 20.

The phase interpolation circuit 12 generates and outputs complementary clock signals RCKP, RCKN of F/2 (Hz), which is referred to as recovery clock, and complementary clock signals SCKP, SCKN of F/2 (Hz), which is referred to as sampled clock.

The four samplers 13 sample the serial data inputted from the receiving circuit 10 while synchronizing with the respective four-phase clock signals RCKP, RCKN, SCKP, SCKN outputted from the phase interpolation circuit 12, and outputs four sampling data DR0, DS0, DR1, DS1.

The phase comparison circuit 14 generates serial phase information signals EARLY_1, LATE_1 on the basis of the four sampling data DR0, DS0, DR1, DS1, which are outputted from the samplers 13. The phase comparison circuit 14 outputs the generated signals to the serial/parallel conversion circuit 17. The serial phase information signals EARLY_1, LATE_1 represent the phase relationship between the four-phase clock signals RCKP, RCKN, SCKP, SCKN and the clock signals of the serial data. More specifically, the serial phase information signals EARLY_1, LATE_1 are information representing whether the phase relationship between the clock signals of the received serial data and the four-phase clock signals RCKP, RCKN, SCKP, SCKN is advanced or delayed.

The frequency divider circuit 15 divides a frequency of a clock signal of F/2 (Hz) outputted from the phase interpolation circuit 12 to 2/N, so as to generate a clock signal DCLK of F/N (Hz). "N" denotes the number of parallel bits in serial/parallel conversion. The serial/parallel conversion circuit 17 converts the serial phase information signals EARLY_1, LATE_1 outputted from the phase comparison circuit 14 into parallel phase information signals EARLY_2[N−1:0], LATE_2[N−1:0] of reduced data rates, while synchronizing with the clock signal DCLK outputted from the frequency divider circuit 15. The relatively low-speed clock signal DCLK outputted from the frequency divider circuit 15 is also inputted into the phase tracking circuit 18 and the frequency tracking circuit 19 forming the digital filtering circuit 16.

The digital filtering circuit 16 eliminates jitter components in the parallel phase information signal outputted from the serial/parallel conversion circuit 17. The digital filtering circuit 16 also calculates an amount of phase adjustment and a direction of phase adjustment. The digital filtering circuit 16 includes the phase tracking circuit 18 and the frequency tracking circuit 19.

The phase tracking circuit 18 determines the direction of a shift of the phase of the clock signal ICKP in the receiver based on the parallel phase information signals EARLY_2[N−1:0], LATE_2[N−1:0]. The phase tracking circuit 18 generates phase advance/delay signals EARLY_3 and LATE_3 representing instantaneous advance/delay of phase.

The frequency tracking circuit 19 performs time integration for a certain period of time with respect to the advance/delay of the phase, based on the parallel phase information signals EARLY_2[N−1:0], LATE_2[N−1:0]. The frequency tracking circuit 19 detects a frequency deviation of received data from the clock signal in the receiver. Further, the frequency tracking circuit 19 generates a phase deviation signal FSCALE in terms of an amount of phase. The frequency tracking circuit 19 determines and outputs the phase deviation signal FSCALE to combine the phases of the four-phase clock signals RCKP, RCKN, SCKP, SCKN with those of clock signals of the serial data. The combination is based on phase information and frequency information acquired from the parallel phase information signals EARLY_2 [N−1:0], LATE_2 [N−1:0]. The phase deviation signal FSCALE indicates an amount of phase adjustment to the four-phase clock signals.

One of ICKP, ICKN, QCKP or QCKN, which are clock signals having a frequency higher than the above-described clock DCLK, is inputted from the PLL circuit 11 into the phase control amount processing circuit 20. The phase control amount processing circuit 20 generates a phase control signal FCS based on the phase advance/delay signals EARLY_3 and LATE_3 from the phase tracking circuit 18 and based on the phase deviation signal FSCALE from the frequency tracking circuit 19. The phase control signal FCS is outputted from the phase control amount processing circuit 20 to the phase interpolation circuit 12. The phase control signal FCS is used to control the phases of the clock signals RCKP, RCKN, SCKP, SCKN outputted from the phase interpolation circuit 12 to the samplers 13. The phase control signal FCS is synchronized with the high-speed clock signals ICKP, ICKN, QCKP, and QCKN. The phase control amount processing circuit 20 generates the phase control signal FCS by mixing the phase advance/delay signals EARLY_3 and LATE_3 and the phase deviation signal FSCALE, for example. The phase control amount processing circuit 20 generates phase quadrant codes IP, QP representing which quadrant the phase control signal FCS is located at. The phase control amount processing circuit 20 outputs the codes to the phase interpolation circuit 12. The details of the above description will be described below.

For the phase control signal FCS outputted from the phase control amount processing circuit 20, a code string, which is referred to as thermometer code, can be used. The thermometer code is characterized in that a bit "1" or a bit "0" appears in succession and that only one bit-changeover occurs, for example.

Figure 2:
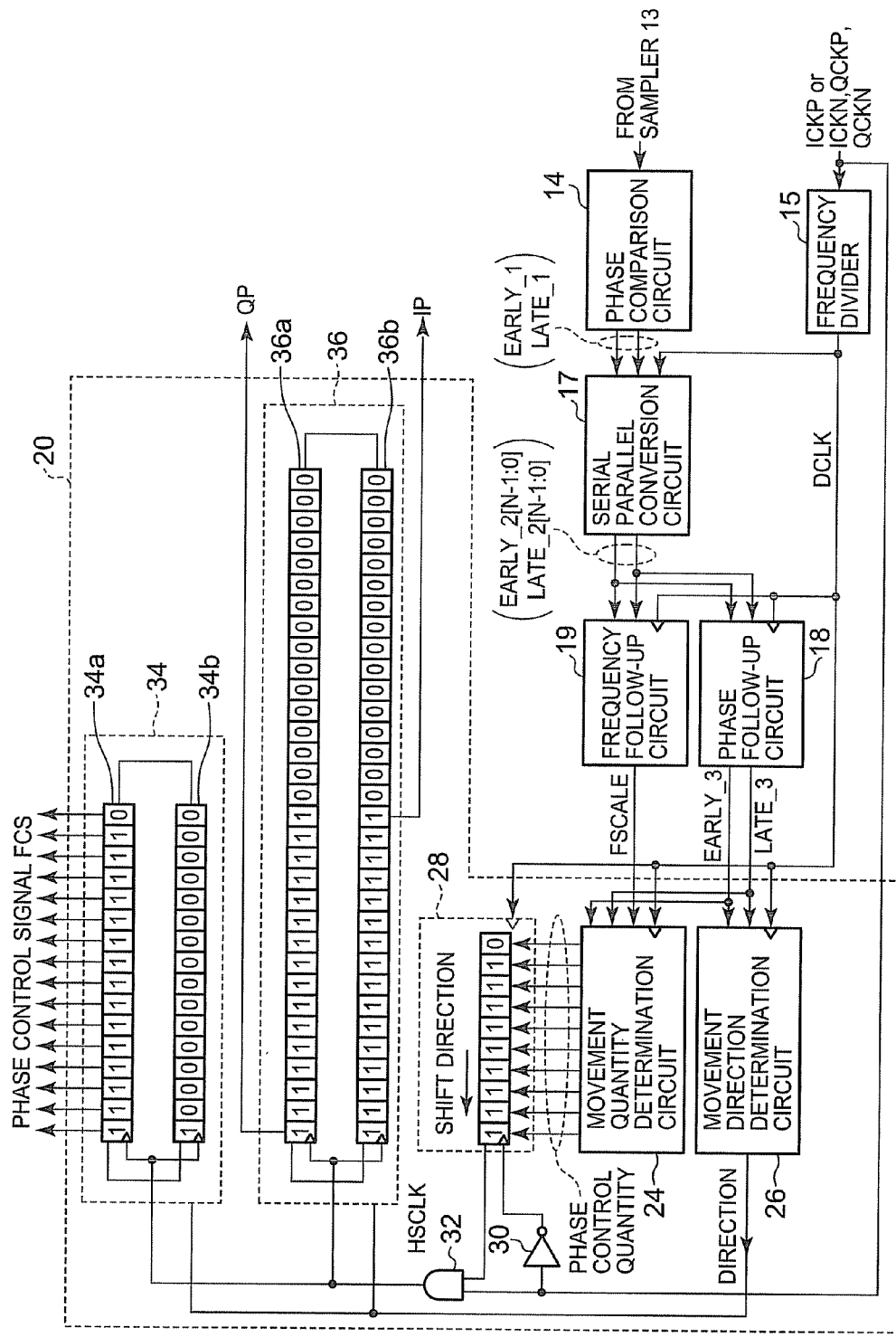
FIG. 2 is a block diagram showing a configuration of a phase control amount processing circuit.

FIG. 2 is a block diagram showing a configuration of the phase control amount processing circuit 20 of the embodiment. The phase control amount processing circuit 20 shown in FIG. 2 includes a function for allowing phase adjustment of the clock recovery circuit to be performed at high speed.

In FIG. 2, the main units of the phase control amount processing circuit 20 include a shift amount determination circuit 24, a shift direction determination circuit 26, a shift register 28, a ring register 34 which generates the phase control signal FCS, and a ring register 36 which generates the phase quadrant codes IP, QP.

The operation of the phase control amount processing circuit 20 shown in FIG. 2 will be described. The operations of the phase comparison circuit 14, the frequency divider circuit 15, the serial/parallel conversion circuit 17, the phase tracking circuit 18, and the frequency tracking circuit 19 are as described above with reference to FIG. 1.

The shift direction determination circuit 26 determines the shift directions, that is, directions of rotation, of the ring registers 34, 36, based on the phase advance/delay signals EARLY_3 and LATE_3 from the phase tracking circuit 18. To be more precise, the sum of "1"s included in the phase advance signal EARLY_3 and the sum of "1"s included in the phase delay signal LATE_3 are compared with each other, and a signal DIRECTION, with which the shift directions of the ring registers 34, 36 are determined, is outputted.

The shift amount determination circuit 24 determines a phase control amount based on the phase advance/delay signals EARLY_3 and LATE_3 from the phase tracking circuit 18 and based on the phase deviation signal FSCALE from the frequency tracking circuit 19. The phase control amount is added to or subtracted from the phase of the inputted clock signal ICKP. The determined phase control amount is set to or written on the shift register 28 in synchronization with the low-speed clock signal DCLK. The amount written on the shift register 28 becomes an updated phase control amount.

The shift amount determination circuit 24 may determine the phase control amount by using a processing result performed by the shift direction determination circuit 26, and by using the phase deviation signal FSCALE. In order to implement such processing, the shift amount determination circuit 24 receives the phase deviation signal FSCALE from the frequency tracking circuit 19 and the processing result of the shift direction determination circuit 26.

Each bit value of the phase control amount transmitted to the shift register 28 is transmitted to an AND circuit 32 one bit after another as a serial signal, in synchronization with a clock signal obtained by an inverter 30. The inverter 30 inverts a high-speed clock signal, for example, a clock signal ICKP. The above clock signal ICKP is inputted into the AND circuit 32. The AND operation of the AND circuit 32, which is performed between the bit value transmitted from the shift register 28 and the clock signal ICKP, produces an operation clock signal HSCLK for the ring registers 34, 36. As shown in FIG. 1, the clock signal RCKP, RCKN, SCKP, or SCKN obtained by interpolation by the phase interpolation circuit 12 may be used as an input clock signal to the frequency divider circuit 15.

"0" is preferably written on a most significant bit (hereinafter, referred to as "MSB") of the shift register 28. When "0" written on the MSB is inputted into the AND circuit 32, the operation clock HSCLK outputted from the AND circuit 32 turns to "0", so that the operation of the ring registers 34, 36 can be securely stopped. This processing means that an upper limit of the shift amount determined by the shift amount determination circuit 24 is limited to 9 bits. Therefore, in order to limit the upper limit of the shift amount, which is determined by the shift amount determination circuit 24, to 6 bits, for example, it is only necessary to write "0"s up to a fourth bit from the MSB of the shift register 28.

Values, which are to be output values of the phase control signal, are written in advance on the ring register 34 which generates the phase control signal FCS of the thermometer code. Similarly, values, which are to be output values of the phase quadrant codes, are written in advance on the ring register 36 which generates the phase quadrant codes IP, QP. It is assumed that "1111111111111110" is stored in a register 34a which is provided on an upper stage of the ring register 34. It is also assumed that "1000000000000000" is stored in a register 34b which is provided on a lower stage of the ring register 34. Further, it is also assumed that "1111111111111110000000000000000" is stored in ring registers 36a and 36b.

For the ring registers 34, 36, the shift direction, i.e., direction of rotation, of each bit sequence of the ring registers 34, 36 is determined by the output signal DIRECTION from the shift direction determination circuit 26. Data stored in the ring registers 34, 36 are shifted by one bit after another in synchronization with the clock signal HSCLK. For example, when the shift direction corresponds to the direction for advancing the phase, bit sequences stored in the ring registers 34, 36 are shifted clockwise. In the ring register 34, the bit sequence of the upper register 34a is shifted rightward by one bit after another. For example, a bit "0" at the rightmost end of the upper register 34a is shifted to the rightmost end of the lower register 34b. Further, the bit sequence of the register 34b is shifted leftward by one bit after another. For example, a bit "1" at the leftmost end of the register 34b is shifted to the leftmost end of the register 34a.

In the same manner, in the ring register 36, the bit sequence of the upper register 36a is shifted rightward by one bit after another. For example, a bit "0" at the rightmost end of the upper register 36a is shifted to the rightmost end of the lower register 36b. Further, the bit sequence of the register 36b is shifted leftward by one bit after another. For example, a bit "1" at the leftmost end of the register 36b is shifted to the leftmost end of the register 36a. In the circuit 20 of FIG. 2, the bit sequence of 16 bits stored in the upper register 34a is outputted as the phase control signal FCS. Further, the leftmost bit of the upper register 36a is outputted as the phase quadrant code QP. In addition, the sixteenth bit from the left of the lower register 36b is outputted as the phase quadrant code IP.

Figure 3:
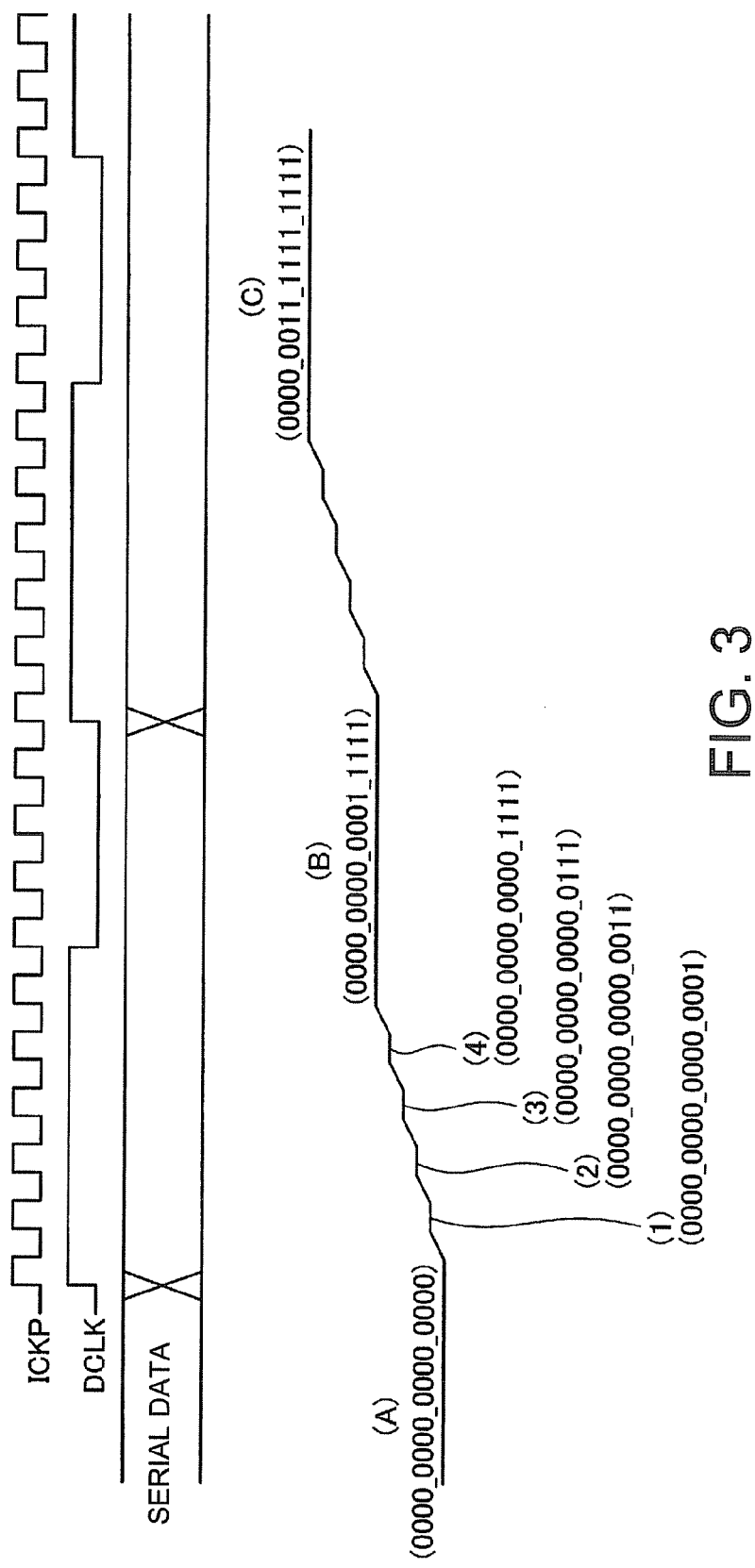
FIG. 3 is a diagram showing change of a phase control signal with respect to time.

FIG. 3 is a diagram showing change of the phase control signal FCS, which is outputted from the phase control amount processing circuit 20, with respect to time. The upper part of FIG. 3 shows a clock signal ICKP, a clock signal DCLK, and a serial data. The lower part of FIG. 3 shows bit sequences (A), (B) and (C) as examples of the phase control signals outputted from the phase control amount processing circuit 20. The bit sequences (A), (B) and (C) show a phase change of 5 bits, respectively. In a phase control amount processing circuit shown in JP2007-60652, a signal corresponding to the bit sequences (A), (B) and (C) are outputted at a cycle or timing of a low-speed clock signal.

On the other hand, the operation of the phase control amount processing circuit 20 of the embodiment is shown in FIG. 3. The bit sequence (B) is generated after bit sequences (1) to (4) are outputted The bit sequences (1) to (4) are obtained by changing the phase of the bit sequence (A) as an initial value by one bit after another, and outputted in the order of (1)→(2)→(3)→(4). In other words, in the embodiment, the phase control amount processing circuit 20 outputs the phase control signals FCS in synchronization with the high-speed clock signal ICKP.

As described above, the phase control amount processing circuit 20 determines the phase control amount based on the phase deviation signal FSCALE and the phase advance/delay signals EARLY_3, LATE_3, which are synchronized with the low-speed clock signal DCLK and which are obtained by the digital filtering circuit 16. The phase control amount processing circuit 20 outputs the phase control amount in synchronization with the high-speed clock signal ICKP. This enables the phase interpolation circuit 12 to be controlled in synchronization with the high-speed clock signal ICKP, and allows reduction in the phase control amount being received at a time.

Further details of the circuit configuration for implementing the clock recovery circuit, according to the embodiment, will be described. Additional technical matters necessary for implementing the clock recovery circuit will be described.

Figure 4:
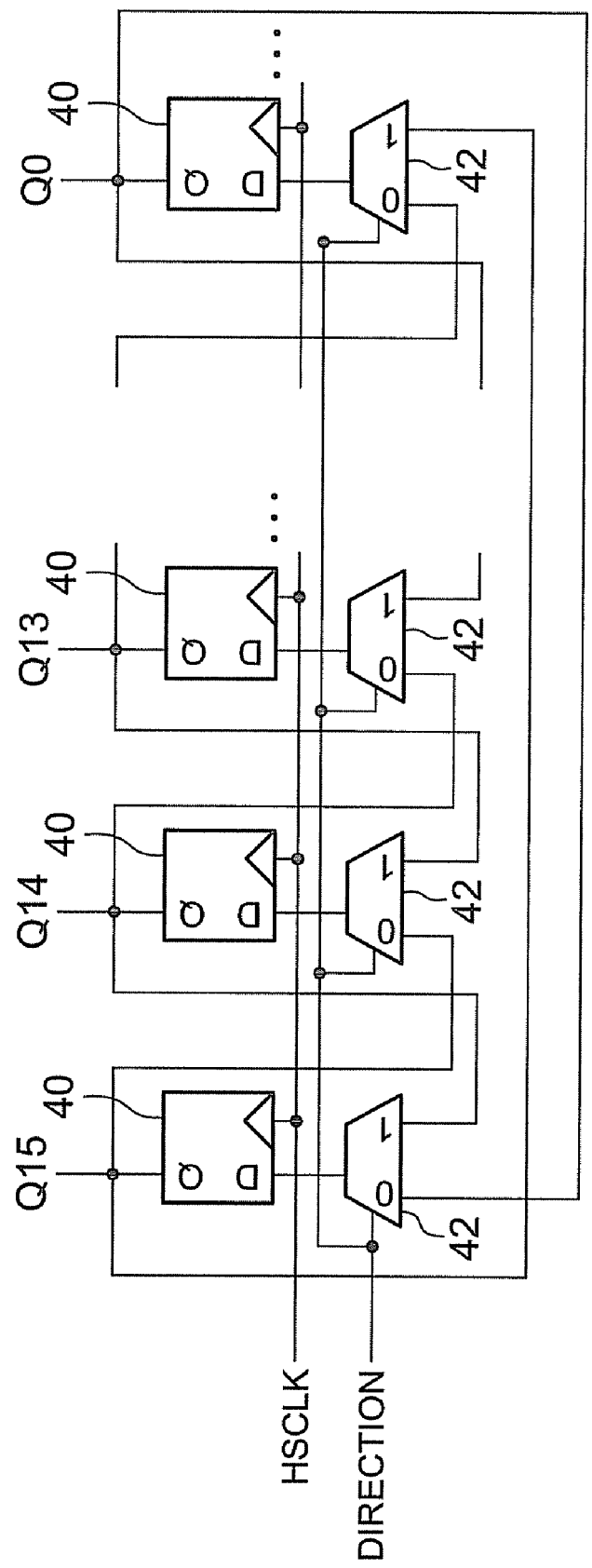
FIG. 4 is a circuit diagram showing an example of a shift register which is used as a ring register.

FIG. 4 is a diagram showing an example of a shift register applicable to the ring register 34 shown in FIG. 2. FIG. 4 shows the configuration of the upper register 34a of the ring register 34, particularly. The configuration of the lower register 34b of the ring register 34 is similar to that of the upper register 34a. The shift register shown in FIG. 4 includes multiple flip-flops 40 and multiple selectors 42. Output terminals Q0 to Q15 of the flip-flops 40 are connected in cascade with input terminals of the respective selectors 42. Specifically, each of the output terminals Q0 to Q15a is connected in cascade with each input terminal (of a "1" side) of adjacent one of the selectors and with each input terminal (of a "0" side) of adjacent another one of the selectors. The output terminal Q0 of one of the flip-flops, which is located at a right end, is connected to the input terminal (of the "0" side) of one of the selectors corresponding to the output terminal Q15. The output terminal Q15 of one of the flip-flops is connected to the input terminal of the "1" side of one of the selectors corresponding to the output terminal Q0. The output signal DIRECTION of the shift direction determination circuit 26 is inputted as a selection signal for each selector 42. The clock signal HSCLK of the AND circuit 32 is inputted into each flip-flop 40.

In accordance with the shift resistor described above, it is determined which one of input signals from adjacent flip-flops is selected, using the output signal DIRECTION of the shift direction determination circuit 26. Further, bit shift operation is performed using the clock signal HSCLK.

The shift register shown in FIG. 4 is also applicable to the ring register 36 by changing the number of bits.

Figure 5:
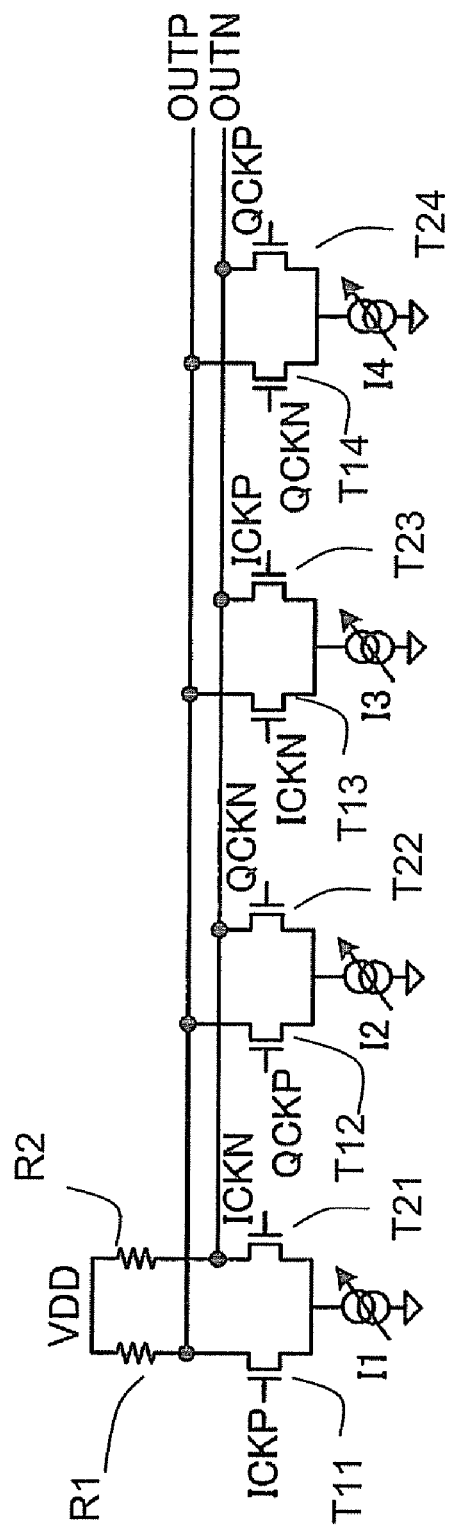
FIG. 5 is a diagram showing an example of a circuit which is used as a phase interpolator circuit.
Figures 6, 7:
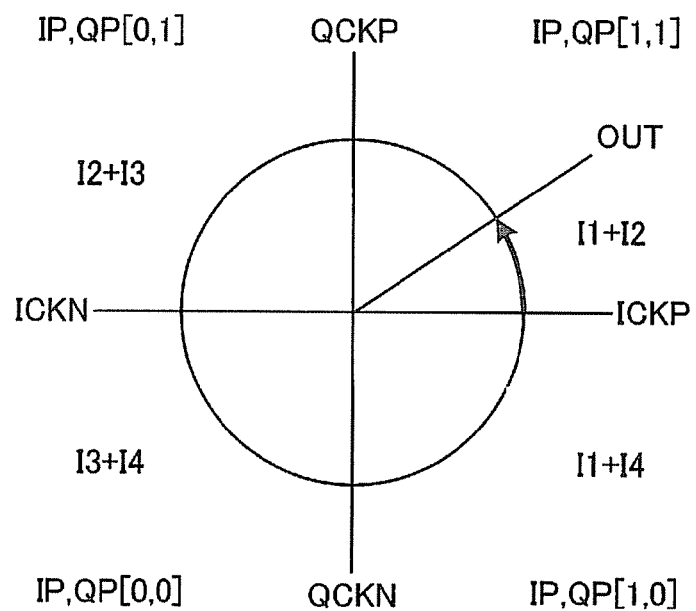
FIG. 6 is a table showing the relationship between phase quadrant codes IP, QP and electric current sources being used in the respective quadrants.
FIG. 7 is a diagram showing the phase quadrant codes IP, QP and the electric current sources being used in the respective quadrants, on a phase space.

FIG. 5 is a diagram showing an example of a circuit configuration applicable to the phase interpolator circuit 12 shown in FIG. 1. FIG. 6 is a table showing relationships between the phase quadrant codes IP, QP outputted from the ring register 36, and electric current sources being used in the first to fourth quadrants. FIG. 7 is a diagram showing the phase quadrant codes IP, QP and the electric current sources being used in the first to fourth quadrants on a phase space.

In the phase interpolation circuit 12 shown in FIG. 5, first transistors T11 to T14 and second transistor T21 to T24 compose four differential circuits. Drains of the first transistor T11 to T14 are connected to each other, whereas drains of the second transistor T21 to T24 are connected to each other. Further, in each of the differential circuits, sources of the first transistors T11 to T14 is connected to a source of the second transistors T21 to T24, and are connected to different current sources 11 to 14, respectively. In addition, mutually-connected ends of the first transistors T11 to T14 are connected to a power source terminal VDD via a resistor R1, and the other mutually-connected ends of the second transistors T21 to T24 are connected to the power source terminal VDD via a resistor R2.

When the magnitudes of the current sources I1 to I4 represent phase adjustment currents, the phase adjustment currents I1 to I4 and the phase control signal FCS from the ring register 34 have relationships as shown in the following equations using a reference current.

$I1$=(the number of "0"s in the phase control signal)× (the reference current)

$I2$=(the number of "1"s in the phase control signal)× (the reference current)

$I3$=(the number of "0"s in the phase control signal)× (the reference current)

$I4$=(the number of "1"s in the phase control signal)× (the reference current)

For example, as shown in FIG. 6, the current sources I1 and I2 are used to perform phase adjustment on the first quadrant. The clock signals ICKP, QCKP outputted from the PLL circuit 11 are inputted into the gates of the corresponding transistors T11, T12. The current sources I1 and I2 operate at current values corresponding to bit values of the phase control signal. Thus, clock signals are newly obtained by interpolating the clock signals ICKP, QCKP.

Two extremely different cases will be described. When each bit of the phase control signal FCS represents "0," the magnitude of the current source 12 is "0 (zero)", and only the output along the axis of the clock signal ICKP appears. When each bit of the phase control signal FCS represents "1," the magnitude of the current source I1 is "0 (zero)", and only the output along the axis of the clock signal QCKP appears. Therefore, when neither of the magnitudes of the current sources I1, I2 is "0 (zero)", an output of the first quadrant appears (see FIG. 7). The clock signals are interpolated using the output.

Figure 8:
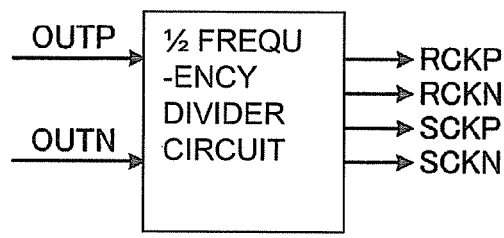
FIG. 8 is a diagram showing an input/output relationship of a divide-by-two frequency divider circuit being used for an output stage of a phase interpolator circuit.
Figure 9:
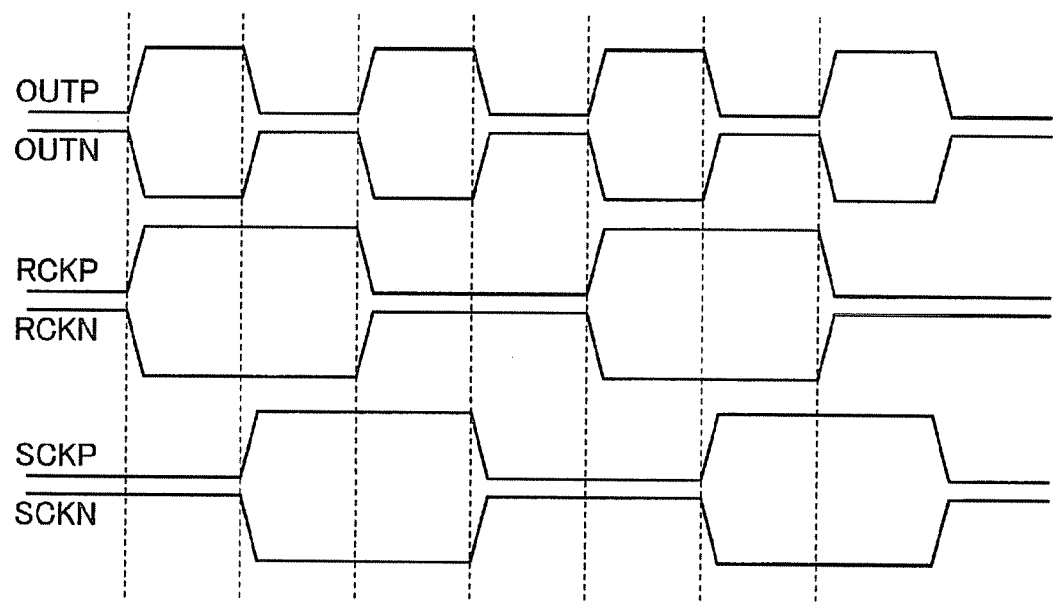
FIG. 9 is a diagram showing an input/output waveform of the divide-by-two frequency divider circuit.

FIG. 8 is a diagram showing input/output relationship of a divide-by-two frequency divider circuit used for an output stage of the phase interpolator circuit 12. FIG. 9 is a diagram showing input/output waveforms of the divide-by-two frequency divider circuit. The divide-by-two frequency divider circuit of FIG. 8 reduces the frequencies of differential clock signals OUTP, OUTN, which are generated by the phase interpolation circuit 12 shown in FIG. 5, to the half, and generates four-phase clocks RCKP, RCKN, SCKP, SCKN shown in FIG. 9. As described above, the generated four-phase clock signals become operation clocks for the samplers 13.

Figure 10:
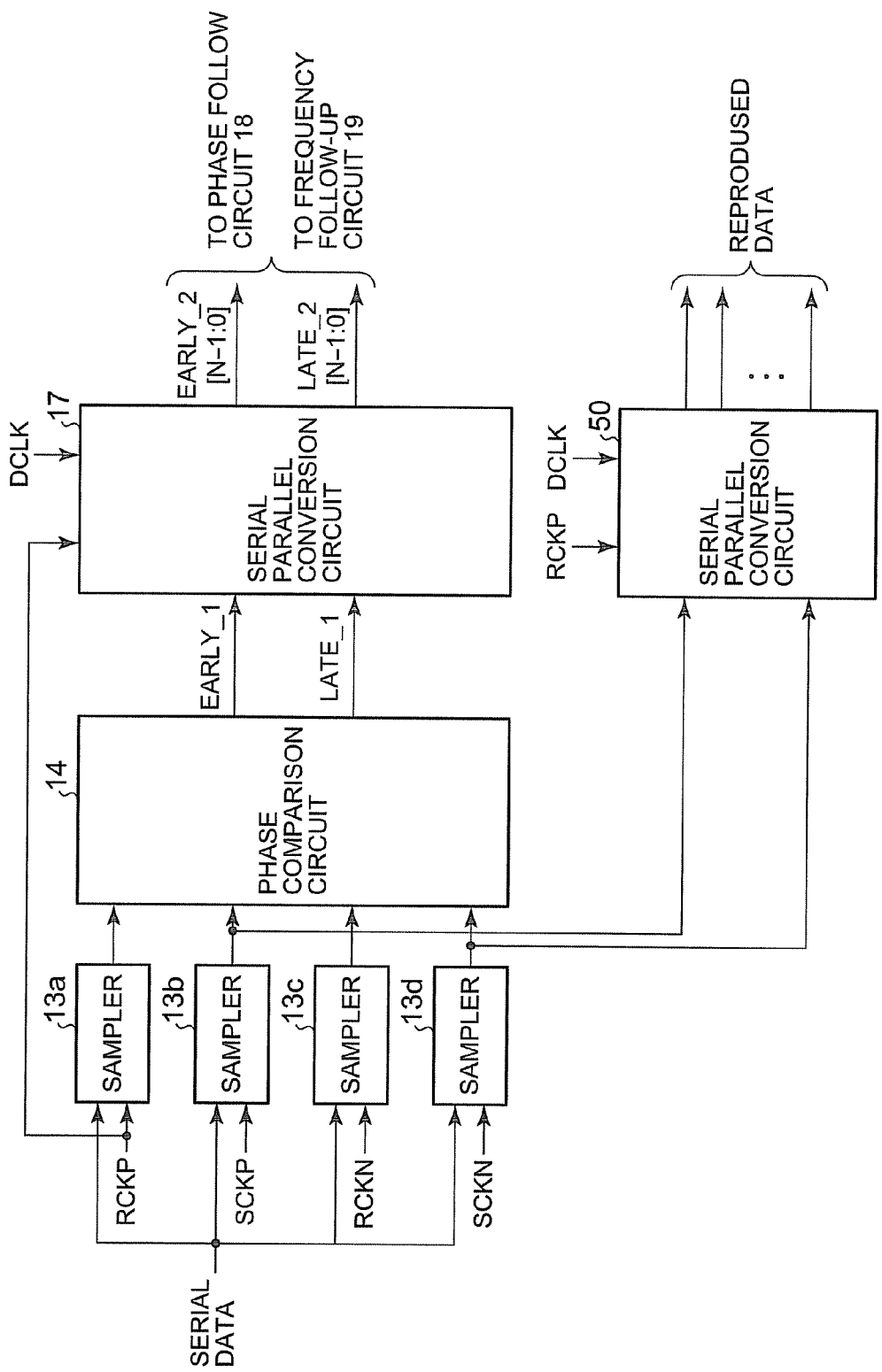
FIG. 10 is a block diagram showing a configuration of a data recovery circuit according to another embodiment of the invention.
Figure 11:
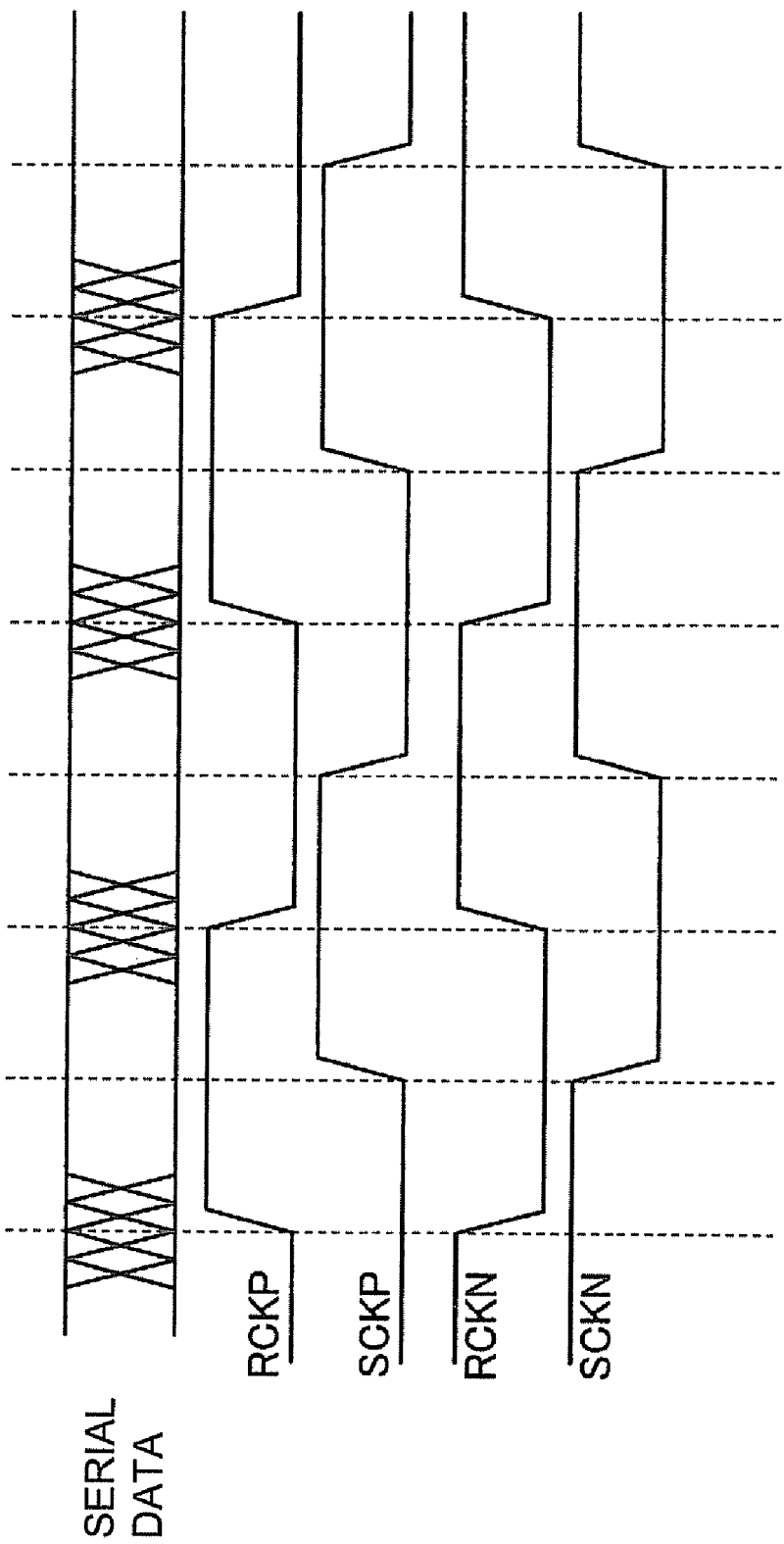
FIG. 11 is a diagram showing a phase relation between serial data and four-phase clock signals.

FIG. 10 is a diagram showing a configuration a data recovery circuit according to another embodiment of the invention. FIG. 11 is a diagram showing a phase relationship between inputted serial data and obtained clock signals RCKP, SCKP, RCKN, SCKN, in a state in which the clock recovery circuit shown in FIG. 1 is locked up with the serial data.

Samplers 13$a$, 13$c$ of FIG. 10 sample a transition area of inputted serial data with the clock signals RCKP, RCKN in the above state. The samplers 13$b$, 13$d$ sample a stable area of the inputted serial data with the clock signals SCKP, SCKN (see FIG. 11). Sampling data outputted from the samplers 13 are transmitted to the phase comparison circuit 14. The processing of the phase comparison circuit 14 is as described above.

Among the data pieces outputted from the samplers 13, the data pieces sampled by the samplers 13$b$, 13$d$ using the clock signals SCKP, SCKN are those sampled on the stable area of the serial data, and therefore can be used as an output of the data recovery circuit. The circuit of FIG. 10 is designed based on such idea. Therefore, the circuit has a configuration in which outputs of the samplers 13$b$, 13$d$ being sampled using the clock signals SCKP, SCKN are inputted into a serial/parallel conversion circuit 50. The serial/parallel conversion circuit 50 is provided to the data recovery circuit separately from the serial/parallel conversion circuit 17. Thus, the above-described clock recovery circuit outputs the data pieces sampled using the clock signals SCKP, SCKN as recovery data from the serial/parallel conversion circuit 50, and therefore can be used as the data recovery circuit.

Figure 12:
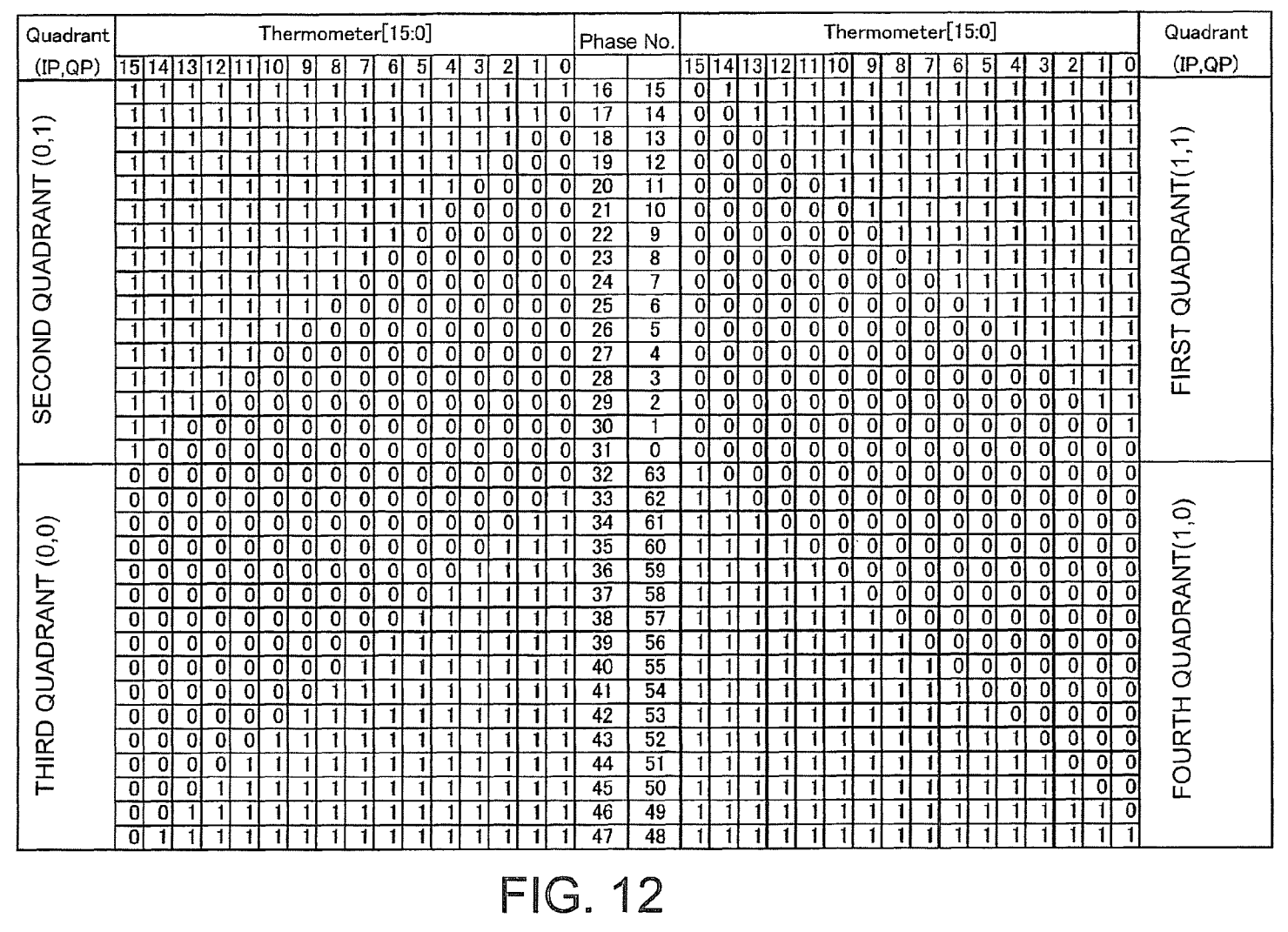

FIG. 12 is a diagram showing an example of a phase control signal represented in thermometer code. As shown in FIG. 12, a bit "1" or a bit "0" appears consecutively in thermometer code, and there is only one-bit change between each adjacent phase Nos. The data, which is stored in the upper register 34$a$ of the ring register 34 in FIG. 2, is represented as the phase No. 15 in FIG. 12.

The states of the ring registers 34, 36 of FIG. 2 show that quadrant signals IP, QP are located in the first quadrant of (1, 1) and that the phase control signal FCS is located on a boundary (phase No. 15) between the first and second quadrants since the phase control signal FCS is "111 . . . 10." When the ring registers 34, 36 are shifted clockwise by one bit from the state of FIG. 2, the bits of the phase control signal FCS outputted from the ring register 34 are "111 . . . 1." The quadrant signals IP, QP outputted from the ring register 36 then becomes (0, 1), which represents a state of change from the phase No. 15 of the first quadrant to the phase No. 16 of the second quadrant. In this way, a bit change in the bit sequence between one phase number and the subsequent phase number is by only one bit. Accordingly, use of such thermometer code is advantageous in the view point of preventing error operation at the time of bit switching.

Advantages of the clock recovery circuit and the data recovery circuit according to the embodiment will be described. A clock recovery circuit of the prior patent document has a problem that an overshoot occurs in phase change, when a phase control signal outputted from a phase control amount processing circuit is an amount of control crossing phase quadrants. This phenomenon occurs since the operation of the phase interpolation circuit instantaneously responds to the quadrant signals IP, QP, but does not instantaneously respond to the change of the phase control signal in the thermometer code, which causes a time delay. The time delay is caused mainly due to a parasitic capacitance, such as wiring, in a constant current circuit, such as a differential circuit and a current source, which forms the phase interpolation circuit. Specifically, the parasitic capacitance, such as wiring, causes time extension until the constant current circuit comes to a stable state.

Figure 13:
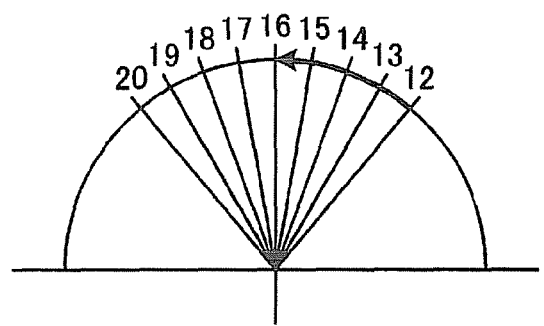
FIG. 13 is a diagram for explaining shift of phase in a phase interpolator circuit of the embodiment.

The above time delay will be explained using a specific example. For example, a case shown in FIG. 13 is assumed. The case is that a switching control is performed from the phase No. 12 of the first quadrant to the phase No. 16 of the second quadrant. In the clock recovery circuit of the embodiment, the phase switching is performed at high speed, so that each one-time phase control or each one-time phase interpolation is performed by one bit at a time. Therefore, the switching control, which switches the phase No. 12 of the first quadrant to the phase No. 16 of the second quadrant, is performed without an overshoot.

Figure 14:
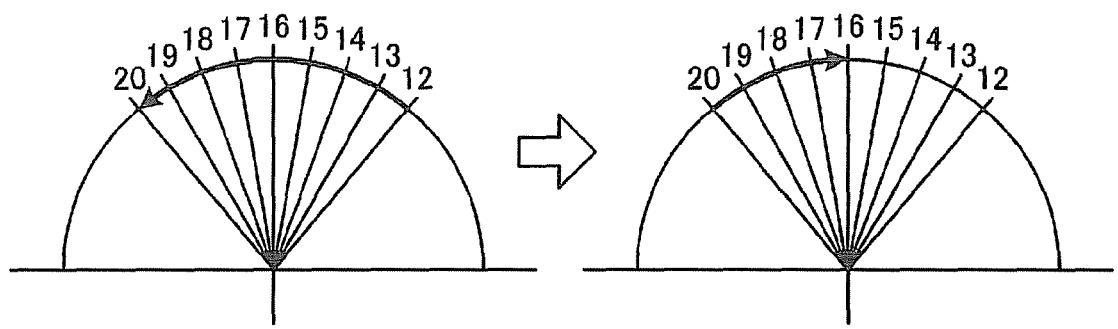
FIG. 14 is a diagram for explaining shift of phase in the phase interpolator circuit.
Figure 15:
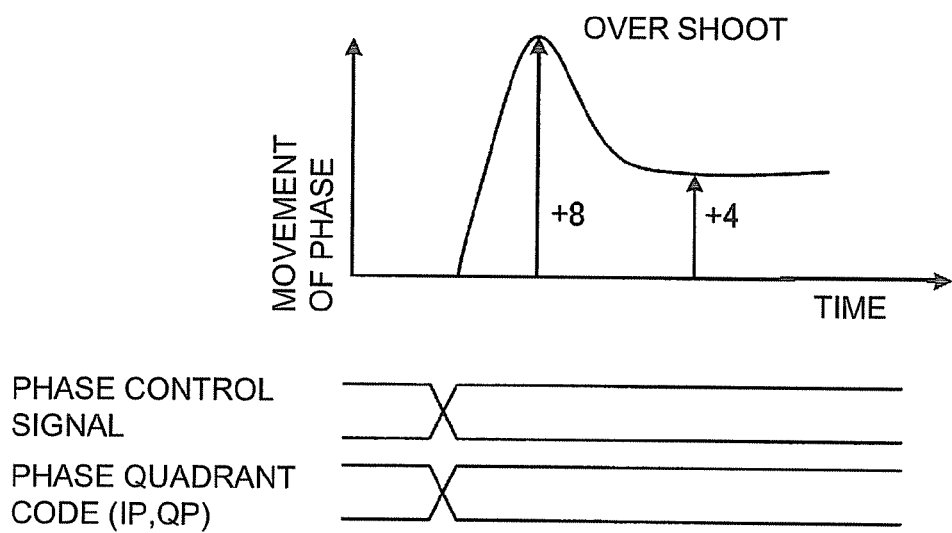
FIG. 15 is a diagram for explaining an overshoot phenomenon in the phase interpolator circuit.

By contrast, in the clock recovery circuit disclosed in the prior patent document, since the quadrant signals IP, QP is switched from (1, 1) indicating the first quadrant to (0, 1) indicating the second quadrant, the phase No. 12 of the first quadrant is recognized as the phase No. 20 of the second quadrant. This occurs because the number of bits "0"s and the number of bits "1"s are the same between the phase No. 12 and the phase No. 20. Accordingly, when performing the switching control from the phase No. 12 to the phase No. 16, the clock recovery circuit disclosed in the prior patent document performs control from the phase No. 12 to the phase No. 20, then to the phase No. 16, as shown in FIG. 14. Hence, an overshoot shown in FIG. 15 occurs.

When serial data having a frequency deviation, such as the spread spectrum clock SSC, are to be tracked, the clock recovery circuit of the patent document has a problem of increase in the number of clock jitters, because the phase adjustment amount at one time is large. For example, when the resolving power of the phase control amount processing circuit is set to ⅟₆₄UI (1UI is the inverse of a transmission data rate F) and when the bit width of serial/parallel conversion is set to 10 bits, the updating cycle of the phase adjustment is F/10. It is said that, in order to track serial data having a frequency deviation of −5000 ppm, 3 Gbps as seen in SATA-Gen 2, phase adjustment of up to ⅝₆₄UI needs to be performed. In the clock recovery circuit disclosed in the prior patent document, updating of the phase adjustment is performed at a cycle corresponding to a process cycle (F/10 cycle) for a digital filter. Accordingly, when following the concept of the clock recovery circuit of the patent document, the phase adjustment of ⅝₆₄UI needs to be performed at every F/10 cycle.

In the clock recovery circuit and the data recovery circuit according to the embodiment, updating of a phase adjustment is performed at the cycle of a data rate (F cycle). Therefore, in the embodiment, ⅟₆₄UI suffices for one-time phase adjustment. In terms of F/10 cycle, the phase adjustment corresponds to ¹⁰⁄₆₄UI.

Figure 16:
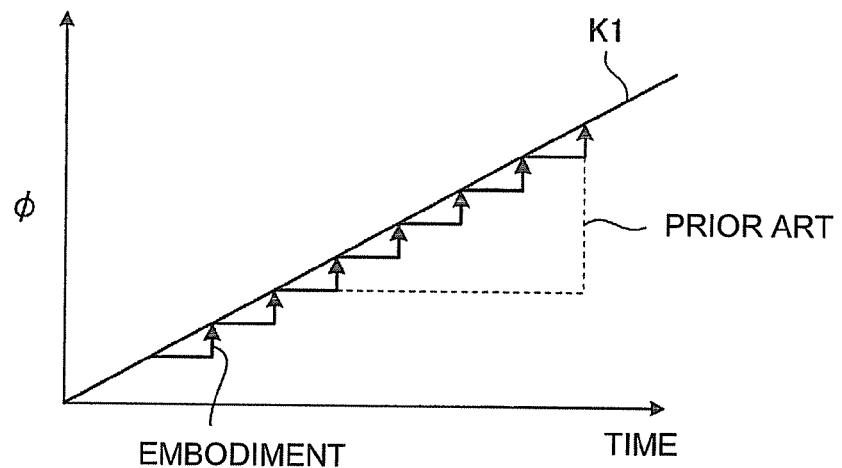
FIG. 16 is a diagram to compare a phase adjustment being performed by the clock recovery circuit of the embodiment, with a phase adjustment according to a clock recovery circuit of a prior art.

FIG. 16 shows phase adjustment by the clock recovery circuit of the embodiment, which is shown in solid line. Further, FIG. 16 shows phase adjustment by a clock recovery circuit according to the prior patent document, which is shown in dashed line. In FIG. 16, a waveform K1 shown in straight line schematically shows a phase change by the spread spectrum clock SSC. In the embodiment, unlike the clock recovery circuit of the prior patent document, it is not necessary to perform the phase adjustment of ⅝₆₄UI at one time, which allows a reduction in the number of clock jitters.

As described above, in accordance with the clock recovery circuit and the data recovery circuit of the embodiments, a serial phase information signal representing a phase relationship between a first clock signal and a clock signal of a serial input signal is converted into a parallel phase information signal, while synchronizing with a second clock signal. Based on the parallel phase information signal, a phase deviation signal and a phase advance/delay signal are calculated. A phase control signal is generated based on the obtained phase deviation signal and the obtained phase advance/delay signal. The generated phase control signal is synchronized with a third clock signal faster than the second clock signal, and is outputted. The first clock signal obtained by adjusting the phase of the third clock signal is interpolated based on the phase control signal, and is outputted as a recovery clock signal. Therefore, an advantage of reduction in the number of clock jitters is obtained.

Other embodiments or modifications of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A clock recovery circuit for recovering clock signal based on inputted serial signal, comprising:
   a plurality of samplers configured to sample a serial input signal in synchronization with a plurality of first clock signals having different phases respectively and to output a plurality of sampling data pieces;
   a phase comparison circuit configured to output a serial phase information signal on the basis of the sampling data pieces, the serial phase information signal representing a phase relationship between a clock of the serial input signal and the different phases of the first clock signals;
   a serial-parallel conversion circuit configured to perform a serial-to-parallel conversion on the serial phase information signal in synchronization with a second clock signal having a frequency lower than that of the first clock signals, and to output a parallel phase information signal;
   a digital filtering circuit configured to calculate a phase deviation signal and a phase advance-delay signal on the basis of the parallel phase information signal, in synchronization with the second clock signal;
   a phase control amount processing circuit configured to generate a phase control signal on the basis of the phase deviation signal and the phase advance-delay signal and to output the phase control signal, the phase control signal being in synchronization with third clock signals having a frequency higher than that of the second clock signal; and
   a phase interpolation circuit configured to adjust the phases of the third clock signals on the basis of the phase control signal, and to output the first clock signals as recovery clock signals.

2. The clock recovery circuit according to claim 1, wherein the third clock signals are produced based on a reference clock signal.

3. The clock recovery circuit according to claim 1, wherein the digital filtering circuit includes:
   a phase tracking circuit configured to determine a direction of shift of the phases of the first clock signals based on the parallel phase information signal, and to generate the phase advance-delay signal representing an instantaneous advance or delay of the phases; and
   a frequency tracking circuit configured to detect frequency deviation of the serial input signal from the first clock signals on the basis of the parallel phase information signal, and to generate the phase deviation signal representing the frequency deviation converted into a phase amount.

4. The clock recovery circuit according to claim 1, wherein the phase control signal outputted from the phase control amount processing circuit is a string of thermometer codes.

5. The clock recovery circuit according to claim 4, wherein the phase control amount processing circuit includes:
   a shift amount determination circuit configured to generate a phase control amount on the basis of the phase deviation signal and the phase advance-delay signal, and to output the phase control amount in synchronization with the second clock signal, the phase control amount being represented by a parallel signal of consecutive "0" or "1";

a shift register configured to output the phase control amount as a serial signal in synchronization with the first clock signals;

a phase control code generation circuit including a ring register in which data of consecutive "0" or "1" are stored in advance, and being configured to generate and output the phase control signal on the basis of the phase control amount; and a shift direction determination circuit configured to determine a direction of shift in the ring register on the basis of the phase deviation signal and the phase advance-delay signal.

6. The clock recovery circuit according to claim 5, wherein the phase advance-delay signal includes a phase advance signal for advancing the phases of the first clock signals, and a phase delay signal for delaying the phases of the first clock signals, and the shift direction determination circuit determines the shift direction in accordance with a result obtained by comparing the sum of "1"s included in the phase advance signal and the sum of "1"s included in the phase delay signal.

7. The clock recovery circuit according to claim 5, wherein the phase control amount processing circuit further includes a phase quadrant code generation circuit having a ring register in which data of consecutive "1" or "0" are stored in advance, the phase quadrant code generation circuit being configured to generate a phase quadrant code representing a quadrant on which the phase control signal is located and to output the generated phase quadrant code to the phase interpolation circuit.

8. A data recovery circuit for recovering clock signal based on inputted serial signal and for recovering data of the inputted serial signal, comprising:

a plurality of samplers configured to sample a serial input signal in synchronization with a plurality of first clock signals having different phases respectively and to output a plurality of sampling data pieces;

a phase comparison circuit configured to output a serial phase information signal on the basis of the sampling data pieces, the serial phase information signal representing a phase relationship between a clock of the serial input signal and the different phases of the first clock signals;

a first serial-parallel conversion circuit configured to perform a serial-to-parallel conversion on the serial phase information signal in synchronization with a second clock signal having a frequency lower than that of the first clock signals, and to output a parallel phase information signal;

a digital filtering circuit configured to calculate a phase deviation signal and a phase advance-delay signal on the basis of the parallel phase information signal, in synchronization with the second clock signal;

a phase control amount processing circuit configured to generate a phase control signal on the basis of the phase deviation signal and the phase advance-delay signal and to output the phase control signal, the phase control signal being in synchronization with third clock signals having a frequency higher than that of the second clock signal;

a phase interpolation circuit configured to adjust the phases of the third clock signals on the basis of the phase control signal, and to output the first clock signals as recovery clock signals; and a second serial-parallel circuit configured to perform a serial-to-parallel conversion on the sampled data pieces in synchronization with the first clock signals, and to output recovery data.

9. The data recovery circuit according to claim 8, wherein the third clock signals are generated based on a reference clock signal.

10. The data recovery circuit according to claim 8, wherein the digital filtering circuit includes:

a phase tracking circuit configured to determine a direction of shift of the phases of the first clock signals based on the parallel phase information signal, and to generate the phase advance-delay signal representing an instantaneous advance or delay of the phases; and a frequency tracking circuit configured to detect frequency deviation of the serial input signal from the first clock signals on the basis of the parallel phase information signal, and to generate the phase deviation signal representing the frequency deviation converted into a phase amount.

11. The data recovery circuit according to claim 8, wherein the phase control signal outputted from the phase control amount processing circuit is a string of thermometer codes.

12. The data recovery circuit according to claim 11, wherein the phase control amount processing circuit includes:

a shift amount determination circuit configured to generate a phase control amount on the basis of the phase deviation signal and the phase advance-delay signal, and to output the phase control amount in synchronization with the second clock signal, the phase control amount being represented by a parallel signal of consecutive "0" or "1";

a shift register configured to output the phase control amount as a serial signal in synchronization with the first clock signals;

a phase control code generation circuit including a ring register in which data of consecutive "0" or "1" are stored in advance, and being configured to generate and output the phase control signal on the basis of the phase control amount; and a shift direction determination circuit configured to determine a direction of shift in the ring register on the basis of the phase deviation signal and the phase advance-delay signal.

13. The data recovery circuit according to claim 12, wherein the phase advance-delay signal includes a phase advance signal for advancing the phases of the first clock signals, and a phase delay signal for delaying the phases of the first clock signals, and the shift direction determination circuit determines the shift direction in accordance with a result obtained by comparing the sum of "1"s included in the phase advance signal and the sum of "1"s included in the phase delay signal.

14. The data recovery circuit according to claim 12, wherein the phase control amount processing circuit further includes a phase quadrant code generation circuit having a ring register in which data of consecutive "1" or "0" are stored in advance, the phase quadrant code generation circuit being configured to generate a phase quadrant code representing a quadrant on which the phase control signal is located and to output the generated phase quadrant code to the phase interpolation circuit.

* * * * *